United States Patent [19]

Itagaki et al.

[11] Patent Number: 5,763,287
[45] Date of Patent: Jun. 9, 1998

[54] METHOD OF FABRICATING SEMICONDUCTOR OPTICAL DEVICE

[75] Inventors: Takushi Itagaki; Tohru Takiguchi; Yutaka Mihashi; Akira Takemoto, all of Tokyo, Japan

[73] Assignee: Mitsubishi Denki Kabushiki Kaisha, Tokyo, Japan

[21] Appl. No.: 593,348

[22] Filed: Jan. 29, 1996

[30] Foreign Application Priority Data

May 1, 1995 [JP] Japan ................................. 7-107363

[51] Int. Cl.$^6$ ................................................. H01L 21/20
[52] U.S. Cl. ........................ 437/126; 437/129; 437/89; 148/DIG. 95
[58] Field of Search ......................... 437/89, 126, 129; 148/DIG. 95, DIG. 106

[56] References Cited

U.S. PATENT DOCUMENTS

| | | | |
|---|---|---|---|
| 5,206,185 | 4/1993 | Hosoba et al. | 437/129 |
| 5,250,462 | 10/1993 | Sasaki et al. | 437/129 |
| 5,436,195 | 7/1995 | Kimura et al. | 437/129 |
| 5,450,437 | 9/1995 | Shim et al. | 437/129 |
| 5,452,383 | 9/1995 | Takiguchi . | |
| 5,486,490 | 1/1996 | Kakimoto | 437/129 |

OTHER PUBLICATIONS

Koyama et al., "Novel Structure MQW Electroabsorption Modulator/DFB–Laser Integrated Device Fabricated By Selective Area MOCVD Growth", Electronics Letters, vol. 27, No. 23, 1991, pp. 2138–2140.

Tabuchi et al, "Optical Coupling Characteristics Of The Semiconductor Laser With A Spot Size Converter", Japanese Society of Electronics, Prescript C–182, 1993.

Kobayashi et al. "Narrow Beam Tapered Thickness Waveguide Integrated BH MQW Laser Operation At High Temperatures", Japanese Society of Electronics, 1993, pp. 191–192.

Primary Examiner—Tuan H. Nguyen
Attorney, Agent, or Firm—Leydig, Voit & Mayer

[57] ABSTRACT

A method of making a semiconductor optical device, including an integrated laser diode and optical waveguide lens with a continuous resonator extending along a resonator length direction between a pair of resonator facets, includes forming a pair of dielectric films disposed on a surface of a substrate on which a semiconductor layer of the optical waveguide is to be grown, the dielectric films having a linear symmetry about a hypothetical line extending in the resonator length direction, having edges opposing each other and parallel to the hypothetical line, and widths perpendicular to the resonator length direction that gradually narrow toward one facet from a position in the resonator length direction of the films. A mask pattern that produces a precise layer thickness profile is easily designed.

12 Claims, 11 Drawing Sheets

METHOD OF FABRICATING SEMICONDUCTOR OPTICAL DEVICE

FIELD OF THE INVENTION

The present invention relates to a selective growth mask used for a selective area growth in which the in-plane distribution on the substrate of the grown layer thickness can be controlled by adjusting the mask pattern and, more particularly, to a selective growth mask used for forming a semiconductor layer constituting an optical waveguide of a semiconductor optical device, the semiconductor device including an integrated laser diode and optical waveguide lens on the same substrate, a method of fabricating a semiconductor optical device using this selective growth mask, and a semiconductor optical device fabricated by this fabricating method.

BACKGROUND OF THE INVENTION

Selective MOCVD growth utilizing a dielectric material mask exploits the effect that growth speed increases in the vicinity of the periphery of the mask. The increase occurs because the growth species that might adhere to or grow on the mask surface diffuses in the vapor phase or on the surface of the mask toward the periphery of the mask and the underlying substrate where crystal growth occurs. In the fabrication of an actual device, a mask including two stripe-shaped dielectric films 102a and 102b having widths $W_m$, as shown in FIG. 9, are disposed on a substrate 101 with a spacing of $W_0$ between them. The effect of increased growth speed in the region between the films (the region of the interval $W_0$) is utilized. Electronics Letters, Volume 27, Number 23, Nov. 7, 1991, pages 2138–2140, describes a relationship between the mask aperture width and the thickness of the grown layer when an InGaAs layer is selectively grown on an InP substrate using a silicon dioxide mask. When an InGaAs layer is selectively grown on an InP substrate, the species are Group III elements, such as In and Ga, supplied as a gaseous metal organic compound, such as trimethylindium (TMIn) or trimethylgallium (TMGa).

The growth speed of the semiconductor layer increases in proportion to the film width $W_m$ and also increases as the mask interval $W_0$ becomes narrower. Thus, there is a difference in the growth speed of the semiconductor layer that is grown in the region between the films and at a region outside the mask. Therefore, the in-plane distribution of the grown layer thickness on the substrate can be controlled by adjusting the mask pattern. In the description below, the magnitude of the increase of the growth speed is represented by the relative growth rate that is obtained by normalizing the growth speed between the films with the growth speed without the mask.

FIG. 10 is a cross-sectional view along the resonator length direction of the active layer of a conventional generalized semiconductor laser including an active layer having a multi-quantum well (MQW) structure employing InP based materials. In the figure, numeral 201 designates an active layer having an MQW structure comprising InGaAsP based materials. The p type InP cladding layer 202 and the n type InP cladding layer 203 are respectively disposed on opposite sides of the active layer 201 with the active layer 201 between them. In addition, the resonator facets 205 and 206 are perpendicular to the respective layers and opposite each other.

In a semiconductor laser having an MQW structure active layer, in order to obtain sufficient light and charge carrier confinement, optimization of the design of the MQW is attempted. Thus, the intensity distribution of the light generated in the active layer is concentrated in the active layer, whereby enhancement of laser characteristics, such as low threshold current, is achieved. In the semiconductor laser having increased confinement of the light in the active layer, however, the beam spot size in the resonator facet $d_s$ is quite small, whereby the beam broadening angle $\theta$ of the emitted laser beam due to diffraction when the laser beam is emitted from the resonator becomes larger.

A semiconductor laser having such a large beam broadening angle in the emitted laser beam is employed as a light source of an optical information transmission system using an optical fiber. In order to enhance the coupling efficiency of the laser light to the optical fiber, a spherical lens 212 is required to collect the laser beam 211 emitted from the laser diode 210 so that the light is incident on the core of the optical fiber 213. An optical coupling module thus has an expensive spherical lens and positional alignment of the optical fiber, the spherical lens, and the laser diode is required, making cost reduction difficult.

On the other hand, if the beam broadening angle of the emitted laser beam is small, it is possible to couple the emitted light beam directly to the optical fiber without employing a spherical lens, and a large cost reduction of the optical coupling module can be achieved.

FIG. 12 shows a semiconductor laser having an integrated optical waveguide lens that converts the spot sizes of the laser diode and the emitted laser beam on a chip, as disclosed in IEEE International Semiconductor Laser Conference, W2.4, 1994, pages 191–192.

In the figure, numeral 301 designates an n type InP substrate. The MQW structure active layer 302 is disposed on the substrate 301 in a stripe mesa configuration, connecting the resonator facets 310a and 310b. Both sides of the mesa are buried by the p type InP burying layer 303 and the n type InP burying layer 304, and the p type InP cladding layer 305 is disposed on the mesa and on the n type InP burying layer 304. In addition, the p type InGaAs contact layer 306 is disposed on a region in the resonator length direction of the p type cladding layer 305. The insulating film 307 having an opening corresponding to the active layer stripe is disposed on the contact layer 306, and the p side electrode 308 is disposed on the insulating film 307 and the contact layer 306 in contact with the contact layer 306 in the aperture of the insulating film 307. In addition, an n side electrode 309 is disposed on the rear surface of the substrate 301.

This semiconductor laser includes a region 315 of the active layer 302 having a constant thickness in the resonator length direction while a region 316 of the active layer 302 has a thickness that becomes gradually thinner toward the resonator facets. The region 315 functions as a laser diode and the region 316 functions as an optical waveguide lens that converts the spot size of the emitted laser beam. In addition, in this semiconductor laser, in the resonator length direction, the region at which the contact layer 306 is provided functions as a gain region.

FIG. 13 is a diagram illustrating operation of the semiconductor laser device shown in FIG. 12. In FIG. 13, the same reference numerals as in FIG. 12 designate the same elements.

When a forward direction bias is applied to the pn junction via the p side electrode 308 and the n side electrode 309, light emission due to recombination of charge carriers occurs in the active layer 302 of the gain region, producing laser light. Then, since the light confinement in the laser diode is sufficient, the quantity of the laser light emitted into the cladding layer 301 and the substrate 301 is small, and a large portion of the laser light advances and is confined in the waveguide. The laser light emitted from the facet 310a at the optical waveguide lens 316 includes, because the MQW waveguide has a smaller thickness closer to the facet 310a, a large quantity of the light emitted into the cladding layer 305 and the substrate 301 and that advances in a state of weak confinement into the waveguide. In addition, the emission of light is larger closer to the end of the lens. Accordingly, the light emitted from the facet 310a where the optical waveguide lens is provided has an emitted light spot size $d_{S2}$, larger than the emitted spot size $d_{S1}$, of the light from the facet 310b where the optical waveguide lens is not provided. The diffraction of the emitted beam becomes small and the beam broadening angle θ2 of the radiation light from the facet 310a is about 2.5°–5°, which is smaller than the broadening angle θ1 of the radiation light from the facet 310b which is about 10°–15°.

In FIG. 13, only the beam broadening angle in the layer thickness direction of the active layer is illustrated, but the beam broadening angle in the width direction of the waveguide is also narrowed because, when the waveguided light is broadened in the thickness direction of the waveguide, the waveguided light is also broadened in the waveguide width direction. In this way, in the semiconductor laser that has an integrated optical waveguide lens, the broadening angle of the emitted light can be made small and, therefore, the spherical lens of the optical coupling module is unnecessary and a large reduction in the cost of the optical coupling module is achieved.

In the publication, selective MOCVD is used for fabricating a semiconductor laser with an integrated optical waveguide lens. Use of a dielectric material mask is proposed. However, the publication does not explain the pattern of the dielectric material mask used in the method.

A selective MOCVD growth method for fabricating a semiconductor laser that has an integrated optical waveguide lens using a dielectric mask is also disclosed in *Japanese Society of Electronics, Information, Communication Engineers of Japan*, 1993 Autumn Meeting, Prescript C-182. FIG. 14 shows part of the fabricating process. In the figure, numeral 401 designates an InP substrate. Numerals 402a and 402b designate silicon dioxide films for selective growth on the substrate 401. The arrow 410 designates the resonator length direction of the semiconductor laser.

As shown in FIG. 14, the silicon dioxide films 402a and 402b are arranged as a mask with a narrow interval in the region 403 where the laser diode is formed, and the widths of the respective films in the direction perpendicular to the resonator length direction are uniform in the resonator length direction. On the other hand, in the region 404 where the optical waveguide lens is formed, the silicon dioxide films 402a and 402b are arranged so that the mask interval is wider closer to the resonator facet, and the widths of the respective films in the direction perpendicular to the resonator length direction are narrower closer to the resonator end. In the region between the films on the substrate 401 on which the silicon dioxide films 402a and 402b are provided, the lower cladding layer, the MQW structure waveguide layer, the upper cladding layer, and the contact layer are selectively grown in this order by MOCVD. The respective layers have a narrow part, and the largest increase in the growth speed arises in the region 403 having a relatively wide width. In the region 404, the growth speed is decreased closer to the resonator facet and the respective layers are thinner closer to the resonator facet.

FIG. 15 shows a relative growth rate profile in the resonator length direction when the semiconductor layer is selectively grown on a substrate on which the selective growth mask, as shown in FIG. 14, is provided. As shown in this figure, by selectively growing a semiconductor layer forming an optical waveguide of a semiconductor laser, a thickness profile in which the grown layer is thicker at the semiconductor laser and becomes gradually thinner in the optical waveguiding direction is realized, and two functional elements of a semiconductor laser and an optical waveguide lens are fabricated together. By fabricating this tapered layer thickness profile with high precision, the irradiation angles of the laser light emitted from the facet of the lens are narrowed in both the vertical direction and the horizontal direction, and the lens effect is realized.

In the semiconductor optical device including an integrated laser diode and optical waveguide lens fabricated utilizing selective growth and a dielectric material mask, in order to realize the desired functions of the optical waveguide lens and the laser diode, it is required to make the layer thickness variation highly precise in the resonator length direction. However, in the prior art method of fabricating an integrated optical waveguide lens and laser diode utilizing selective growth and a dielectric material mask, since the grown layer thickness in the optical waveguide direction is adjusted by changing the width of the dielectric material film and the mask interval simultaneously, there are many parameters that have to be controlled, and design of the mask pattern was complicated.

SUMMARY OF THE INVENTION

It is an object of the present invention to provide a selective growth mask that can be easily used to achieve precise layer thickness profile control.

It is another object of the present invention to provide a selective growth mask that can produce a layer thickness profile of a grown layer that more precisely coincides with the layer thickness profile desired.

It is a still another object of the present invention to provide a method of fabricating a semiconductor optical device that has an integrated laser diode and optical waveguide lens that has good performance.

It is a yet another object of the present invention to provide a semiconductor optical device that has an integrated laser diode and optical waveguide lens that can be easily fabricated and has high performance.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a selective growth mask used for forming a semiconductor layer constituting a stripe-shaped waveguide disposed connecting a pair of resonator facets of a semiconductor optical device including a laser diode and optical waveguide lens continuously in the resonator length direction between the resonator facets by selective area growth comprises a pair of dielectric films disposed on a surface of a substrate on which a semiconductor layer constituting an optical waveguide is to be grown and having a plan view configuration of linear symmetry relative to a hypothetical line extending in the resonator length direction on the substrate surface, edges of the films opposing each other being parallel to the hypothetical line, and widths of the films in the direction perpendicular to the resonator length direction gradually becoming narrower toward the ends in the resonator length direction of the films from a first position in the resonator length direction of the films. Therefore, a mask pattern for precise layer thickness profile control is easily designed.

According to a second aspect of the present invention, in the selective growth mask, the film configuration is a right triangle. Therefore, the difference between the thickness of the thinnest part of the semiconductor layer and the thickest part of the semiconductor layer forming the optical waveguide of the waveguide lens is increased.

According to a third aspect of the present invention, in the selective growth mask, part of the film along the hypotenuse of the right triangle is removed. Therefore, the increase of the relative growth rate of in the central portion in the resonator length direction of the mask is compensated and a relative growth rate profile closer to a design value is obtained.

According to a fourth aspect of the present invention, in the selective growth mask, the widths of the dielectric films gradually become narrower toward both ends in the resonator length direction of the film. Therefore, the layer thickness of the semiconductor forming the optical waveguide of the semiconductor optical device is controlled with high precision with a selective growth mask.

According to a fifth aspect of the present invention, in the selective growth mask, the width is constant from one end to another end in the resonator length direction. Therefore, the layer thickness of the semiconductor layer forming the optical waveguide of the laser diode portion is uniform.

According to a sixth aspect of the present invention, in the selective growth mask, the width is constant at both ends in the resonator length direction and is narrower at the central portion of the resonator length direction than at both ends. Therefore, an increase in the growth rate at the center portion of the resonator length direction of the mask is compensated and the layer thickness of the semiconductor layer forming the optical waveguide of the laser diode portion is more uniform.

According to a seventh aspect of the present invention, a selective growth mask used for forming a semiconductor layer constituting an optical waveguide of a semiconductor optical device which has a pair of resonator facets and a stripe-shaped optical waveguide disposed connecting the resonator facets and which has layer thicknesses that vary with position in the resonator length direction comprises a pair of dielectric films disposed on a surface of a substrate on which a semiconductor layer constituting an optical waveguide is to be grown, having a plan view configuration of linear symmetry relative to a hypothetical line extending in the resonator length direction on the substrate surface, edges of the films opposing each other being parallel to the hypothetical line, and widths in the direction perpendicular to the resonator length direction gradually becoming narrower toward the ends in the resonator length direction from a position in the resonator length direction of the films and approximately zero at the ends. Therefore, design of the mask pattern is simplified.

According to an eighth aspect of the present invention, a method for fabricating a semiconductor optical device which has a laser diode and an optical waveguide lens continuously in a resonator length direction between a pair of resonator facets comprises:

forming a selective mask on a substrate, each mask comprising a pair of dielectric films having plan view configurations of linear symmetry with respect to a hypothetical line extending in the resonator length direction on the substrate surface, edges of the films opposing each other and being parallel to the hypothetical line, and a width in the direction perpendicular to the resonator length direction gradually becoming narrower toward the ends in the resonator length direction of the mask from a position in the resonator length direction of the films; and growing a semiconductor layer forming an optical waveguide of the semiconductor optical device on the substrate using the selective mask.

Therefore, a semiconductor optical device in which the layer thickness of the semiconductor layer forming the optical waveguide is controlled at a desired thickness can be easily fabricated.

According to a ninth aspect of the present invention, a method for fabricating a semiconductor optical device including a laser diode and an optical waveguide lens continuously in a resonator length direction between a pair of resonator facets comprises:

forming a plurality of selective masks on a substrate, each mask comprising a pair of dielectric films having plan view configurations of linear symmetry with respect to a hypothetical line extending in the resonator length direction on the substrate surface, edges of the dielectric films opposing each other being parallel to the hypothetical line, and widths in the direction perpendicular to the resonator length direction of the dielectric material film gradually becoming narrower toward the ends in the resonator length direction of the mask from a position in the resonator length direction of the films; and growing a semiconductor layer forming the optical waveguides of the semiconductor optical device on the substrate using the selective films as a mask.

Therefore, an array type semiconductor optical device in which the layer thickness of the semiconductor layer forming the optical waveguide can be controlled in the resonator length direction to a desired value can be easily fabricated.

According to a tenth aspect of the present invention, a semiconductor optical device including a laser diode and an optical waveguide lens continuously in the resonator length direction between a pair of resonator facets is fabricated by a method comprising:

forming a selective mask on a substrate, each mask comprising a pair of dielectric films having plan view configurations of linear symmetry with respect to a hypothetical line extending in a resonator length direction on the substrate surface, edges of the dielectric films opposing each other being parallel to the hypothetical line, and widths in the direction perpendicular to the resonator length direction gradually becoming narrower toward the ends in the resonator length direction of the mask from a position in the resonator length direction of the films; and growing a semiconductor layer forming the optical waveguide of said semiconductor optical device on said substrate using the selective mask.

Therefore, a semiconductor optical device that has a laser diode and an optical waveguide lens and that can be easily fabricated can be realized.

According to an eleventh aspect of the present invention, a semiconductor optical device which has a laser diode and an optical waveguide lens continuously in a resonator length direction between a pair of resonator facets is fabricated by a method comprising:

forming a plurality of selective masks on a substrate, each mask comprising a pair of dielectric films having plan view configurations of linear symmetry with respect to a hypothetical line extending in the resonator length direction on the substrate surface, edges of the dielectric films opposing each other being parallel to the hypothetical line, and widths in the direction perpendicular to the resonator length direction gradually becoming narrower toward the ends of the mask from a position in the resonator length direction of the films; and growing a semiconductor layer forming the optical waveguides of the semiconductor optical device on the substrate using the selective masks.

Therefore, a semiconductor optical device array that has a laser diode and an optical waveguide lens and that can be easily fabricated is realized.

DETAILED DESCRIPTION OF THE PREFERRED EMBODIMENTS

Embodiment 1

Figure 1:
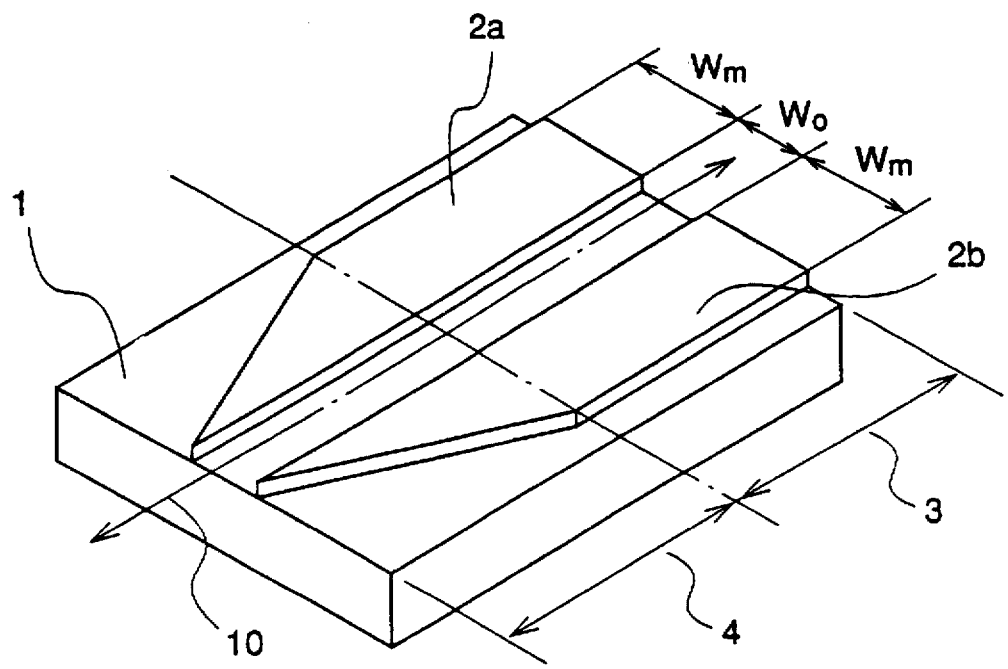
FIG. 1 shows a selective growth mask according to a first embodiment of the present invention.

FIG. 1 shows a selective growth mask disposed on a substrate on which selective growth is carried out according to a first embodiment of the present invention. The selective growth mask of this first embodiment is used when a semiconductor layer constituting a stripe-shaped waveguide connecting a pair of resonator facets of a semiconductor optical device including an integrated laser diode (LD) and optical waveguide lens is formed between the resonator facets.

In the figure, numeral 1 designates a semiconductor substrate on which crystal growth is performed, numerals 2a, 2b designate $SiO_2$ films deposited on the semiconductor substrate 1 and patterned as a mask. The arrow 10 represents the resonator length direction of the semiconductor optical device fabricated using the selective growth using the mask including films 2a, 2b. In addition, numeral 3 designates a region in the resonator length direction where the LD is formed, and numeral 4 designates a region in the resonator length direction where the optical waveguide lens is formed.

As shown in the figure, the selective growth mask of this first embodiment comprises a pair of films 2a, 2b symmetrically disposed relative to the straight line 10 extending in the resonator length direction on the surface of the substrate 1 where the semiconductor layer is to be selectively grown. Here, the film 2a and the film 2b are arranged so that the edges that mutually confront each other are both parallel to the straight line 10 and, accordingly, the interval, i.e., spacing, between the films (mask aperture width) $W_0$ is constant in the resonator length direction. In addition, the widths $W_m$ in the direction perpendicular to the resonator length direction of the films 2a, 2b forming the mask are both narrowed in a tapered shape from a predetermined position of the mask in the resonator length direction, i.e., the connecting point of the LD formation region 3 and the optical waveguide lens formation region 4, toward one end of the mask in the resonator length direction. On the other hand, in the LD formation region 3, the widths $W_m$ in the direction perpendicular to the resonator length direction of the respective films 2a, 2b forming the mask are constant from the connecting position of the region 3 and the region 4 to the other end of the mask in the resonator length direction.

Figure 2:
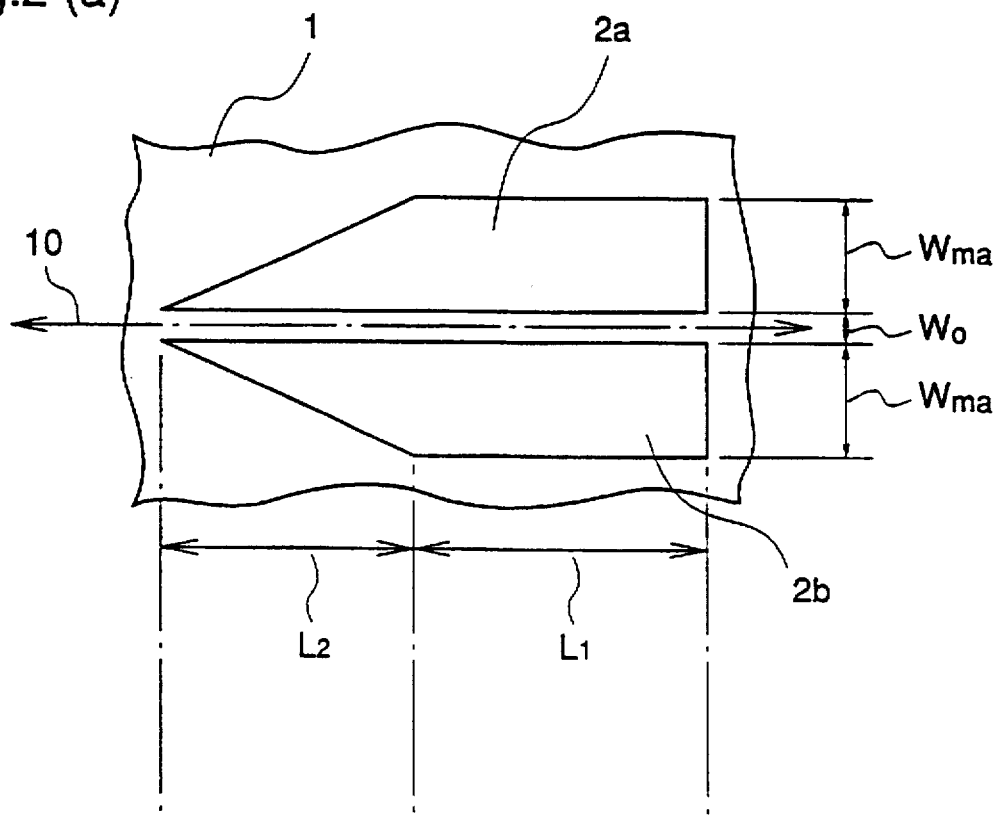
FIGS. 2(a) and 2(b) are a plan view of the selective growth mask according to the first embodiment and a graph showing the relative growth rate ratio profile in the resonator length direction of a grown layer in the center of an aperture of the mask for a selective growth using the growth mask.
Figure 2:
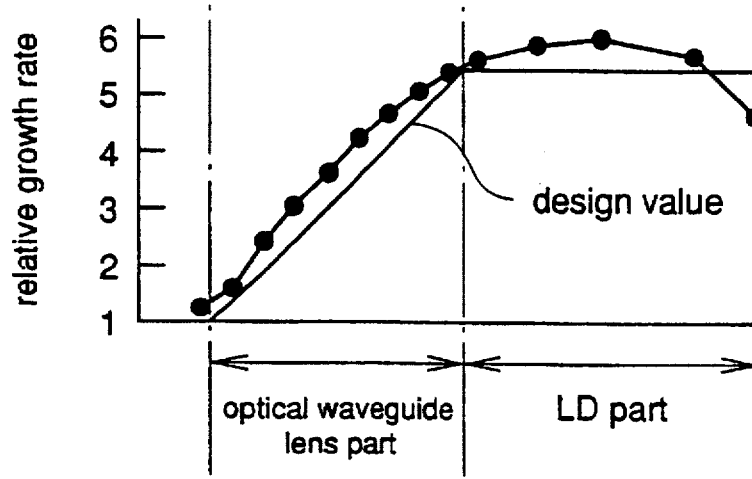

FIG. 2(b) shows a relative growth rate profile in the resonator length direction at the center of the mask opening width when a semiconductor layer is selectively grown on a substrate using the selective growth mask shown in FIG. 1. The dimensions of the mask pattern are as follows: the mask interval (aperture width) $W_0$ is 24 µm, the length $L_1$ of the mask of the LD formation region is 500 µm, the length $L_2$ of the mask at the optical waveguide lens formation region (tapered part) is 500 µm, and the maximum film width $W_{ma}$ is 200 µm.

In FIG. 2(b), it is found that the relative growth rate in the resonator length direction of the semiconductor growth layer is smaller in the mask tapered part than in the LD portion and that a reduction in the relative growth rate is realized in accordance with a reduction in the film width. Here, the maximum growth speed increase factor at the LD portion is about 6, and the difference between that growth speed increase and the growth speed increase at the end of the lens portion, i.e., the selective growth ratio, is about 5.5. In other words, there is a layer thickness difference of about 5.5 times between the thinnest portion of the lens portion and the thickest portion of the LD portion.

In order to enhance the efficiency of the LD and the optical waveguide lens of the integrated semiconductor device, it is required to control precisely the layer thickness profile of respective layers formed in the selective growth process in the resonator length direction. When both the film width and the mask interval (opening width between the films) are changed to control the layer thickness profile of the grown layers as in the prior art, there are many parameters to be controlled, and the design of the mask pattern is complicated. On the other hand, in this embodiment, the mask interval is constant and only the film width is changed to control the layer thickness profile of the grown layer, whereby a mask pattern for high precision layer thickness profile control can be easily designed.

As described above, in the selective growth mask of this first embodiment, only the film width is narrowed in a tapered shape with a constant mask interval, thereby controlling the relative growth rate in the resonator length direction of the semiconductor layer grown on the substrate. Therefore, the design of a mask pattern that controls the layer thickness profile with high precision is simplified.

A process of fabricating a semiconductor optical device including an integrated laser diode and optical waveguide lens on the same substrate using the selective growth mask of this first embodiment is described.

An $SiO_2$ film about 100 nm thick is formed on a (100) surface of a preprocessed n type InP substrate, and a resist is deposited. The mask pattern of this first embodiment is transferred to this resist by photolithography and is developed. Thereafter, the $SiO_2$ film is etched to form a selective growth mask. The InP substrate on which the mask pattern is formed is preprocessed using an acid etchant and placed in an MOCVD apparatus to grow semiconductor layers. The growth is performed in the order of the first n type InP cladding layer 100 nm thick, the MQW active layer comprising seven pairs of barrier layers comprising InGaAsP having a composition corresponding to a photoluminescence wavelength $\lambda_{PL}$ of 1.10 µm and a layer thickness of 2.5 nm and well layers comprising InGaAsP having a composition corresponding to a $\lambda_{PL}$ of 1.37 µm and a layer thickness of 2 nm, the second p type InP cladding layer 100 nm thick, and the p type InGaAs contact layer 50 nm thick. The total grown layer thickness in the vicinity of the top of the taper-shaped mask width region is about 800 nm, approximately the total sum of the layer thicknesses because the growth speed increase is small. The relative growth rate successively increases toward the LD portion by about 5.5 times and the total layer thickness at the LD portion becomes about 1540 nm. After the selective growth process, the selective growth mask is removed.

When it is required to make the entire waveguide a narrow stripe, after the selective growth process, a stripe-shaped dielectric film is provided on the grown layers and, using this stripe-shaped dielectric film as a mask, the grown layers are mesa etched. Thereafter, high resistance InP layers or a plurality of InP layers having conductivity types forming a thyristor structure are formed at both sides of the mesa. In the prior art shown in FIG. 12, the formation of the entire waveguide in a narrow stripe shape is performed using mesa etching and growth of burying layers.

Figure 4:
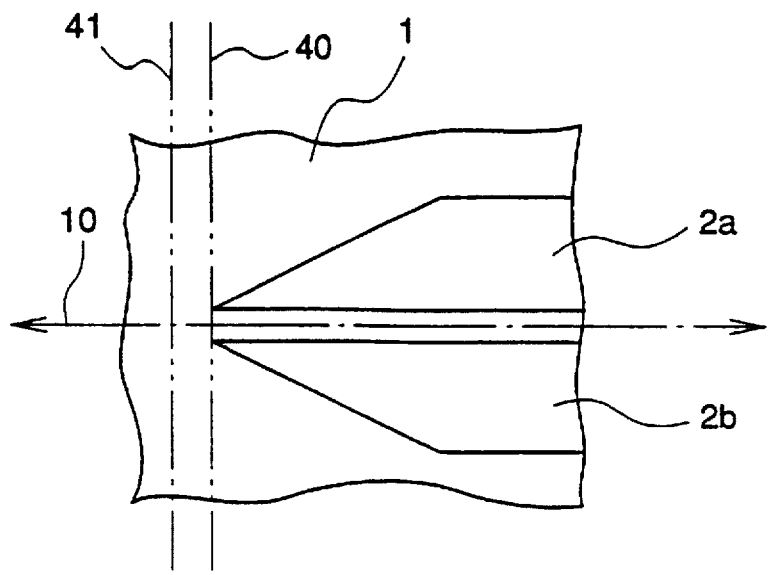
FIG. 4 is a schematic view for explaining a cleavage position in manufacturing a semiconductor optical device using the selective growth mask according to the first embodiment.

After the selective growth process and the narrow stripe formation process, an n side electrode and a p side electrode are formed on the rear surface of the substrate and on the contact layer, respectively, and the wafer is separated into chips by cleaving, whereby semiconductor optical devices are completed. The cleaving may be performed at the position of line 40 where the end of the selective mask is positioned, as shown in FIG. 4. It may be performed at the position of the line 41 which is located beyond the position where the end of the selective growth mask is positioned.

Figure 12:
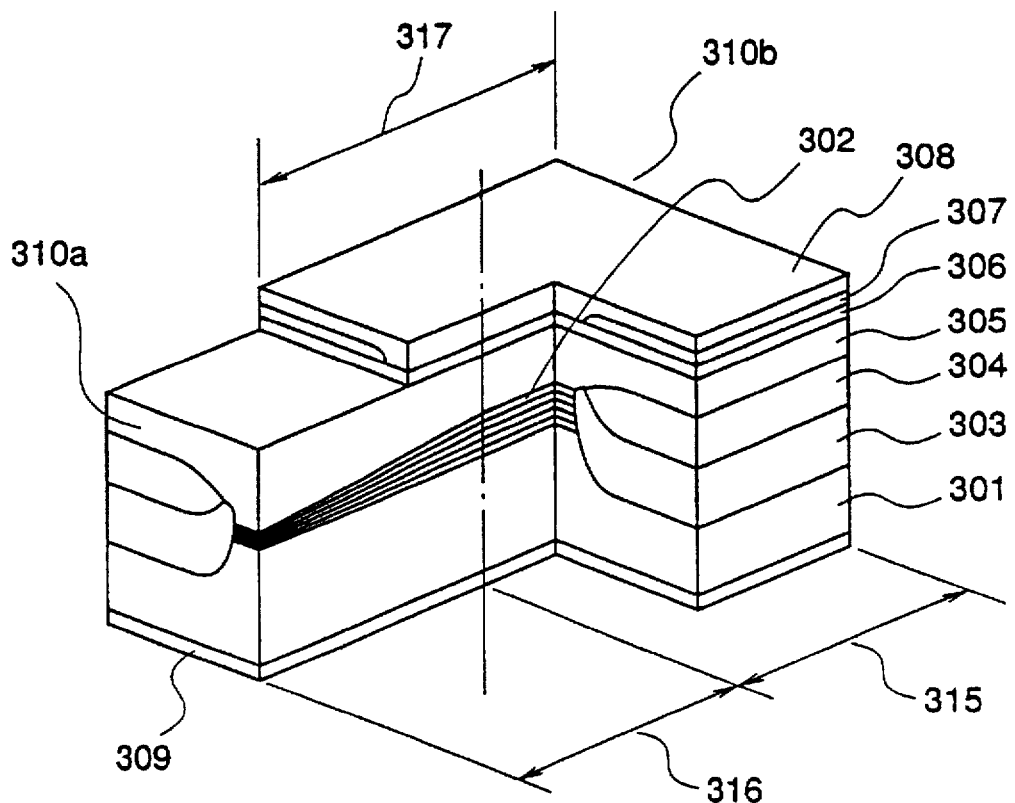
FIG. 12 is a perspective view, partly sectioned, for explaining a prior art semiconductor laser wherein a laser diode and an optical waveguide lens are integrated on a chip.
Figure 13:
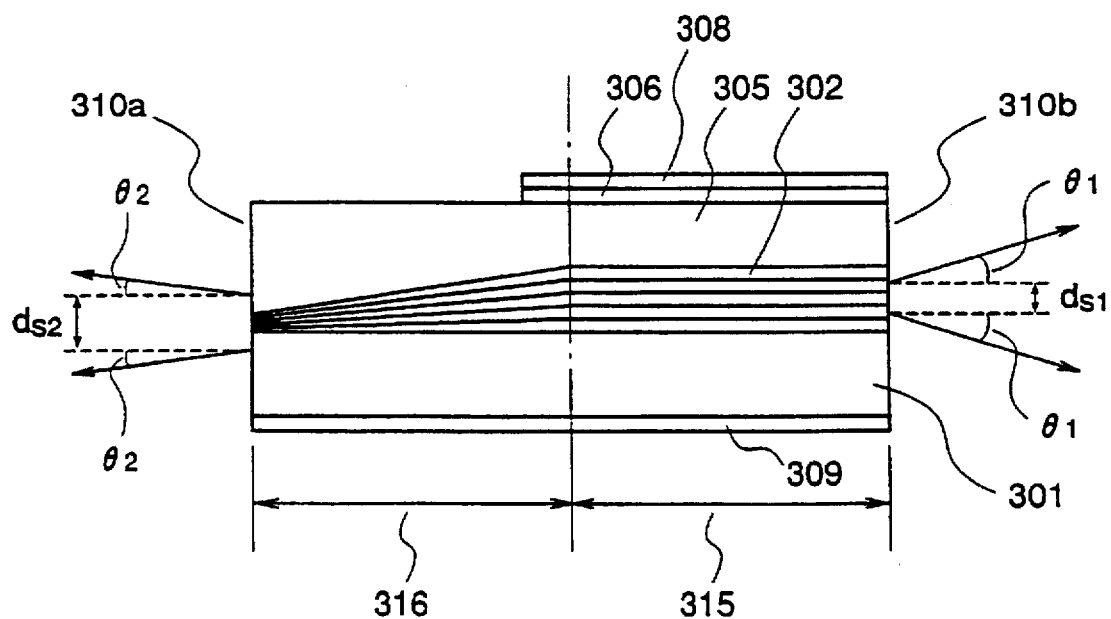
FIG. 13 is a schematic view for explaining the operation of the semiconductor laser shown in FIG. 12.
Figure 14:
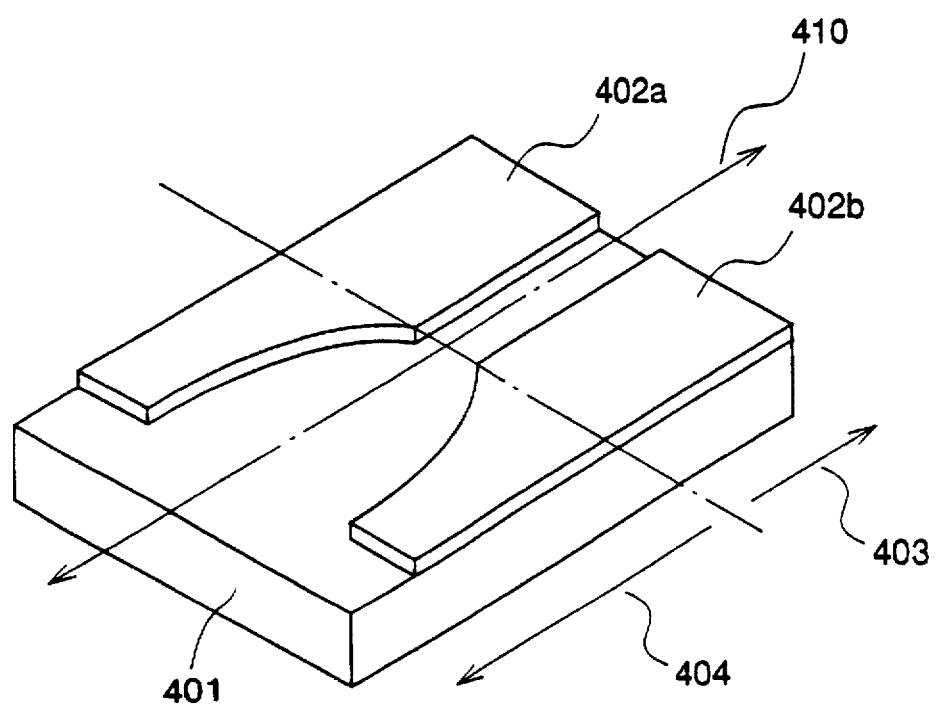
FIG. 14 is a perspective view illustrating a selective growth mask used for selective growth of a semiconductor layer comprising an optical waveguide of a prior art semiconductor optical device wherein a laser diode and an optical waveguide lens are integrated on a chip.
Figure 15:
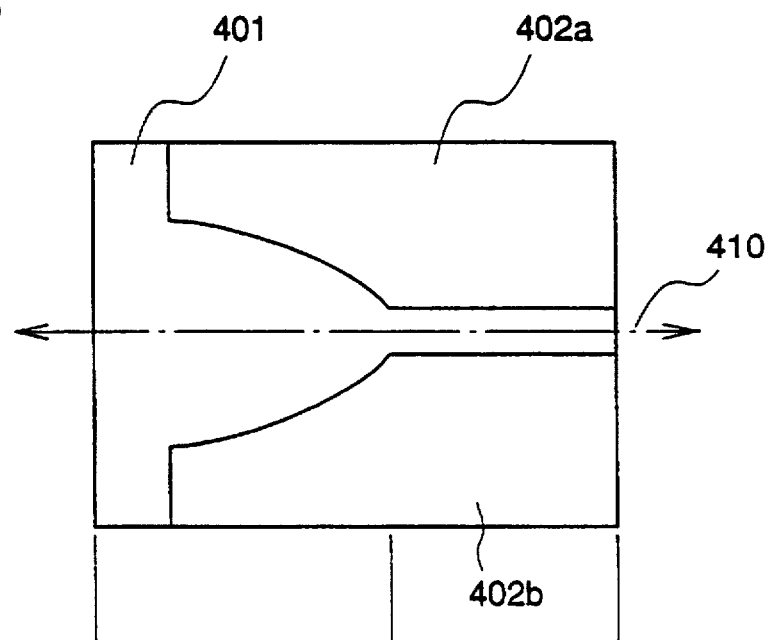
FIGS. 15(a) and 15(b) are a plan view of a prior art selective growth mask and a graph of the selective growth rate ratio profile in a resonator length direction of a grown layer in the center of the aperture width of the mask.
Figure 15:
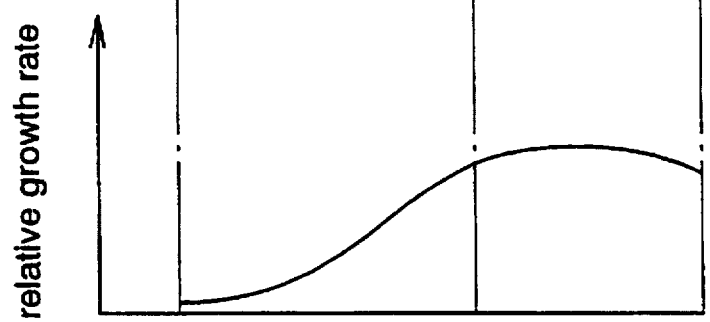

The operation of the semiconductor optical device including an integrated laser diode and optical waveguide lens on the same substrate, fabricated by using the selective growth mask of the first embodiment, is the same as in the prior art device shown in FIG. 12. When a forward direction current is applied to the pn junction through the p side electrode and the n side electrode, light emission by recombination of charge carriers occurs in the MQW active layer of the LD portion, thereby producing laser oscillation. When light confinement in the laser diode is sufficient and the quantity of light output into the upper and the lower cladding layers is small, a larger portion of the laser light advances and is confined in the waveguide. The laser light emitted from the facet at the optical waveguide lens has a large leakage into the upper and lower cladding layers because the MQW waveguide has a smaller layer thickness closer to the facet of the waveguide lens, and the laser light advances in a state of weak confinement in the waveguide. Further, the light is more intense closer to the end of the lens. Accordingly, the emitted light from the facet where the optical waveguide lens is located has a light spot size larger that the spot size of the light from the facet where the optical waveguide lens is not located. Therefore, the diffraction effect upon beam emission is small and the broadening angle of the beam of light from the facet where the optical waveguide lens is located is about 2.5°–5°, which is smaller than the broadening angle of the light from the facet where the optical waveguide lens is not located, which is about 10°–15°.

By performing the selective growth using the selective growth mask pattern of this first embodiment, the radiation angle of the laser light emitted from the lens part is narrowed by the lens effect, and beam broadening is suppressed, whereby a high optical coupling efficiency connection to an optical fiber is easily achieved.

In order to obtain a large optical lens effect, the layer thickness difference between the thinnest lens part and the thickest part should be as large as possible. However, when only the film width is increased in order to increase the thicknesses of the semiconductor layers, an increase in the polycrystalline grains produced on the mask is induced, so the mask width should be as narrow as possible. Accordingly, it is useful to enlarge the thickness difference by making the mask interval narrow. In this first embodiment, because the mask interval is constant, the design process is quite easy.

Further, by making the mask opening width the same as the width of the mesa-etching carried out in a later process, the mesa structure can be formed in the selective growth process, whereby the mesa-etching process becomes unnecessary and the fabrication cost is reduced as compared with the prior art mask.

Figure 5:
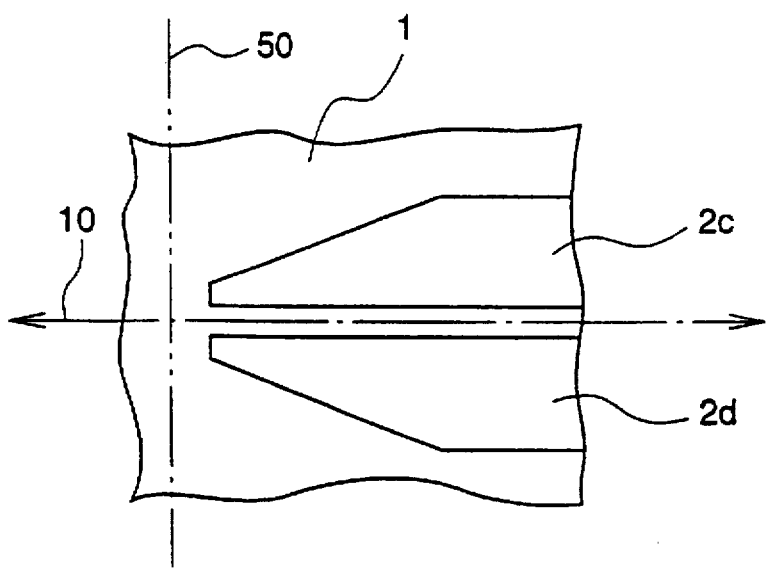
FIG. 5 is a schematic view for explaining the configuration of an alternative selective growth mask and cleavage position in manufacturing a semiconductor optical device using this alternative.

In this first embodiment, the selective growth mask where the width in the direction perpendicular to the resonator length direction of the selective growth mask gradually narrows has a right triangular configuration, i.e., a configuration in which the width in the direction perpendicular to the resonator length direction is narrowed linearly in a tapered shape and the width at the narrowest part is approximately zero. By making the width approximately zero at the narrowest portion, the layer thickness difference between the thinnest lens portion and the thickest portion is large. However, the width of the narrowest portion may not necessarily be approximately zero. For example, it may have some width at the narrowest portion as shown in FIG. 5. In this case, since the selective growth layer at this position is not affected by an increase of the growth speed and the layer is thin, the layer thickness difference between the thinnest lens portion and the thickest portion can be enlarged by cleaving at the position of the line 50, beyond the position where the ends of the films 2c and 2d are located.

Embodiment 2

FIG. 2(b) is a profile of the relative growth rate of the semiconductor layer in the resonator length direction that is desired in order to realize a semiconductor optical device that has an integrated optical waveguide lens and LD. As shown in figure 2(b), in the case where the selective growth mask of the first embodiment is used, the relative growth rate profile in the resonator length direction incompletely coincides with the design profile.

In the selective growth method using the dielectric mask, since two-dimensional diffusion of the growth species on the mask is utilized, the relative growth rate tends to become largest at the central portion in the resonator length direction of the mask. On the other hand, in the first embodiment, the mask width is changed linearly in accordance with the profile of the design. There is, as shown in FIG. 2(b), a coincidence between the actual relative growth rate profile in the resonator direction and the designed profile due to the increased relative growth rate at the central portion in the resonator length direction of the mask. This increase is added to the change of the relative growth rate caused by the change of the mask width. Accordingly, in order to obtain the designed relative growth rate profile, a design considering the increasing relative growth rate at the center portion in the resonator length direction is required.

The second embodiment of the present invention provides a selective growth mask that can realize a relative growth rate profile closer to the design value by considering the effect of the relative growth rate at the central portion in the resonator length direction of the mask.

Figure 3:
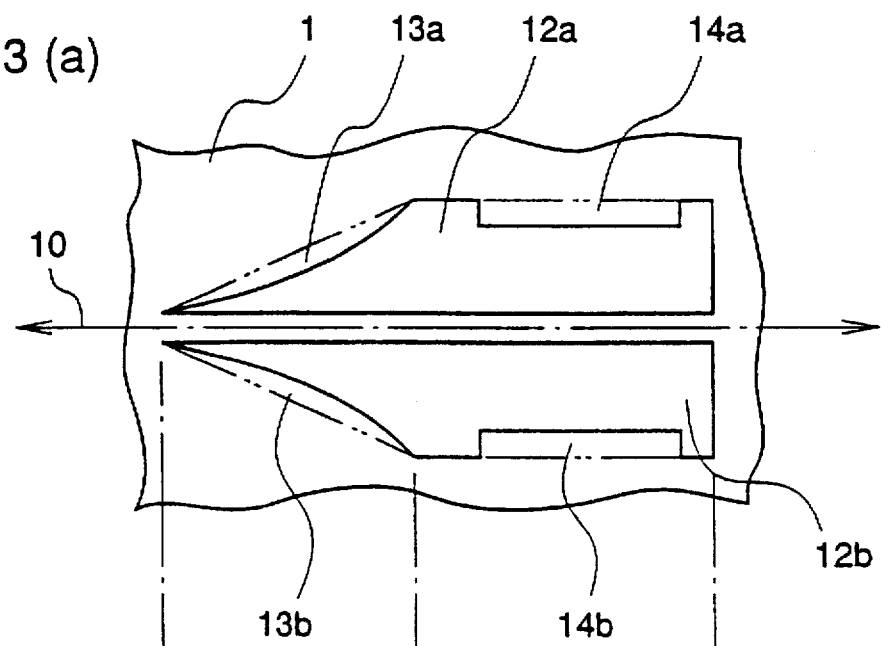
FIGS. 3(a) and 3(b) are a plan view of a selective growth mask according to a second embodiment of the present invention and a graph showing the relative growth rate profile in the resonator length direction of a grown layer in the center of an aperture of the mask for a selective growth using the mask.
Figure 3:
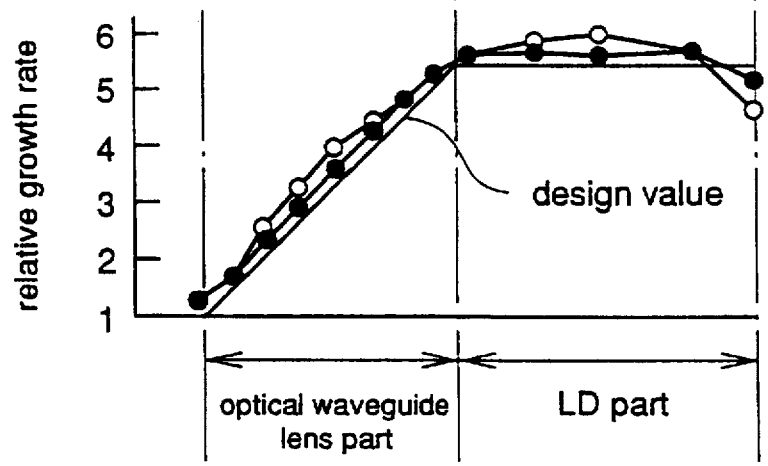

FIG. 3(a) is a plan view illustrating a selective growth mask according to a second embodiment of the present invention. FIG. 3(b) is a diagram showing the relative growth rate profile in the resonator length direction at the central portion of the mask opening in the width direction when the semiconductor layer is selectively grown on the substrate using the selective growth mask shown in FIG. 3(a). In the figures, the same reference numerals designate the same or corresponding elements as those shown in FIG. 2(a). Numerals 12a and 12b designate selective growth masks, numerals 13a and 13b designate removed film width regions at the tapered portions of the films 12a and 12b. Numerals 14a and 14b designate removed film width regions at the LD portions of the films 12a and 12b, respectively.

The relative growth rate profile in the resonator length direction obtained by the selective growth using the selective growth mask of the first embodiment has approximately the same values as the design values at both ends of the tapered portion and rises above the design values at the center of the tapered portion of the mask. From this result, it can be seen that it is sufficient to remove a curvilinear portion corresponding to the increasing thickness from the linearly tapered film. Also in the LD portion, it is sufficient to remove part of the film width at the center portion of the LD portion.

In the selective growth mask according to the second embodiment as shown in FIG. 3(a), the configuration of the selective growth mask of the first embodiment is changed in accordance with these thoughts.

By changing the configuration of the selective growth mask as described above, the effect of an increase of the relative growth rate at the central portion in the resonator length direction of the mask can be compensated and, as shown by ● in FIG. 3(b), a relative growth rate profile closer to the design can be obtained. In FIG. 3(b), the relative growth rate profile in the resonator length direction that is obtained by selective growth using the selective growth mask of the first embodiment is shown by ○ for comparison.

Such partial removal of the mask width contributes to a large reduction in the light irradiation loss of the light waveguide portion and to the enhancement of the fundamental lens performance of the semiconductor optical device fabricated utilizing the selective growth mask. Further, the mask has a great effect on improved laser characteristics due to making the layer thickness uniform and improved composition uniformity of the grown layer in the optical waveguide direction of the LD portion, that is, in a reduction in the oscillation threshold current and the operational current, stabilization of oscillation wavelength, and enhancement of internal efficiency.

Embodiment 3

Figure 6:
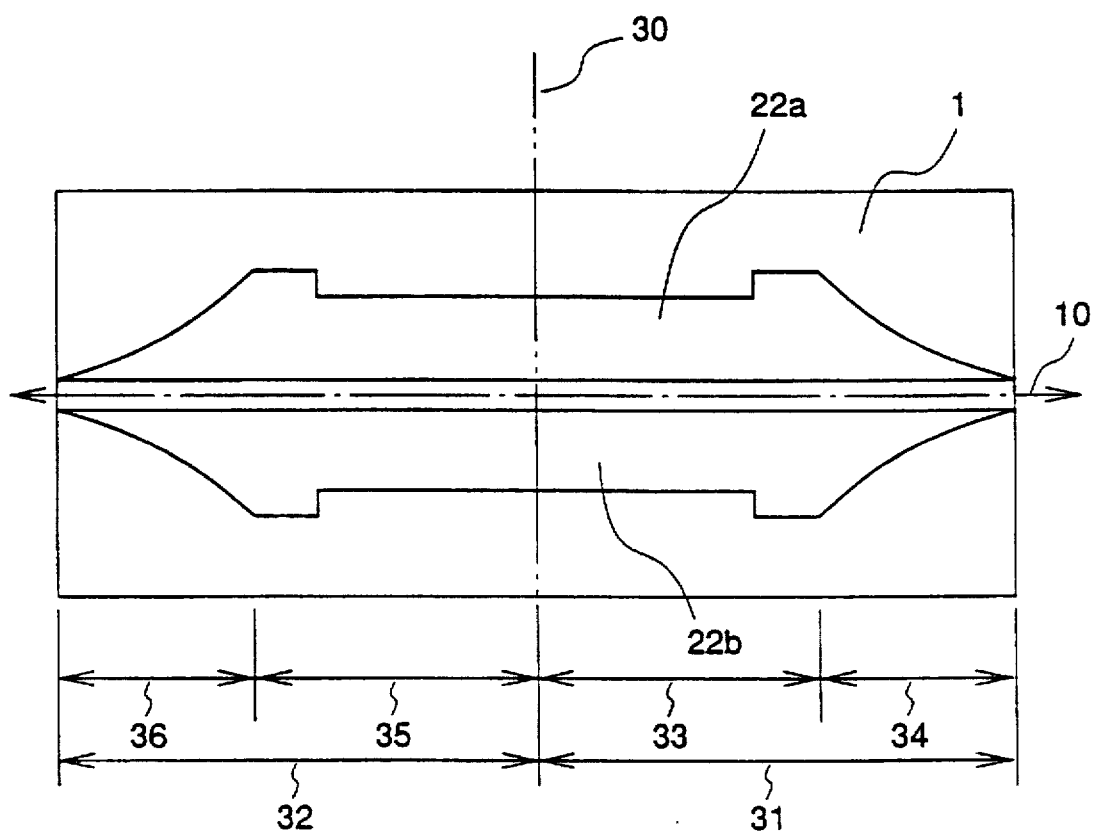
FIG. 6 is a plan view illustrating a selective growth mask according to a third embodiment of the present invention.

FIG. 6 is plan view for explaining a selective growth mask according to a third embodiment of the present invention. In the figure, the same reference numerals designate the same or corresponding elements as shown in FIG. 2(a). Numerals 22a, 22b designate selective growth mask films according to a third embodiment of the present invention. The line 30 shows the cleavage position.

The selective growth mask of this third embodiment has a configuration such that two selective growth masks of the second embodiment are connected with each other with their backs opposite each other. In other words, in the selective growth mask of this third embodiment, the respective films 22a, 22b forming a mask pair are provided with tapered portions at both ends in the resonator length direction.

By forming selective growth masks in such a configuration, the optical waveguide for two semiconductor optical devices can be formed by selective growth using a pair of selective growth masks. More particularly, when the selective growth is performed using the selective growth mask of this third embodiment, the profile in the resonator length direction of the layer thickness of the semiconductor layer that is selectively grown is uniform in the region 33 and the region 35 and is thinner, i.e., tapers, toward the ends in the region 34 and the region 36. Thereafter, by cleaving and separating at the line 30, two semiconductor optical devices 31 and 32 are obtained. In the semiconductor optical device 31, the region 33 becomes the LD and the region 34 becomes the optical waveguide lens. In the semiconductor optical device 32, the region 35 becomes the LD and the region 36 becomes the optical waveguide lens.

In the selective growth mask of this third embodiment, tapered portions are located at both ends in the resonator length direction and, therefore, the layer thickness of the semiconductor layer that forms the optical waveguide for two semiconductor optical devices can be controlled by a pair of selective growth masks.

Embodiment 4

Figure 7:
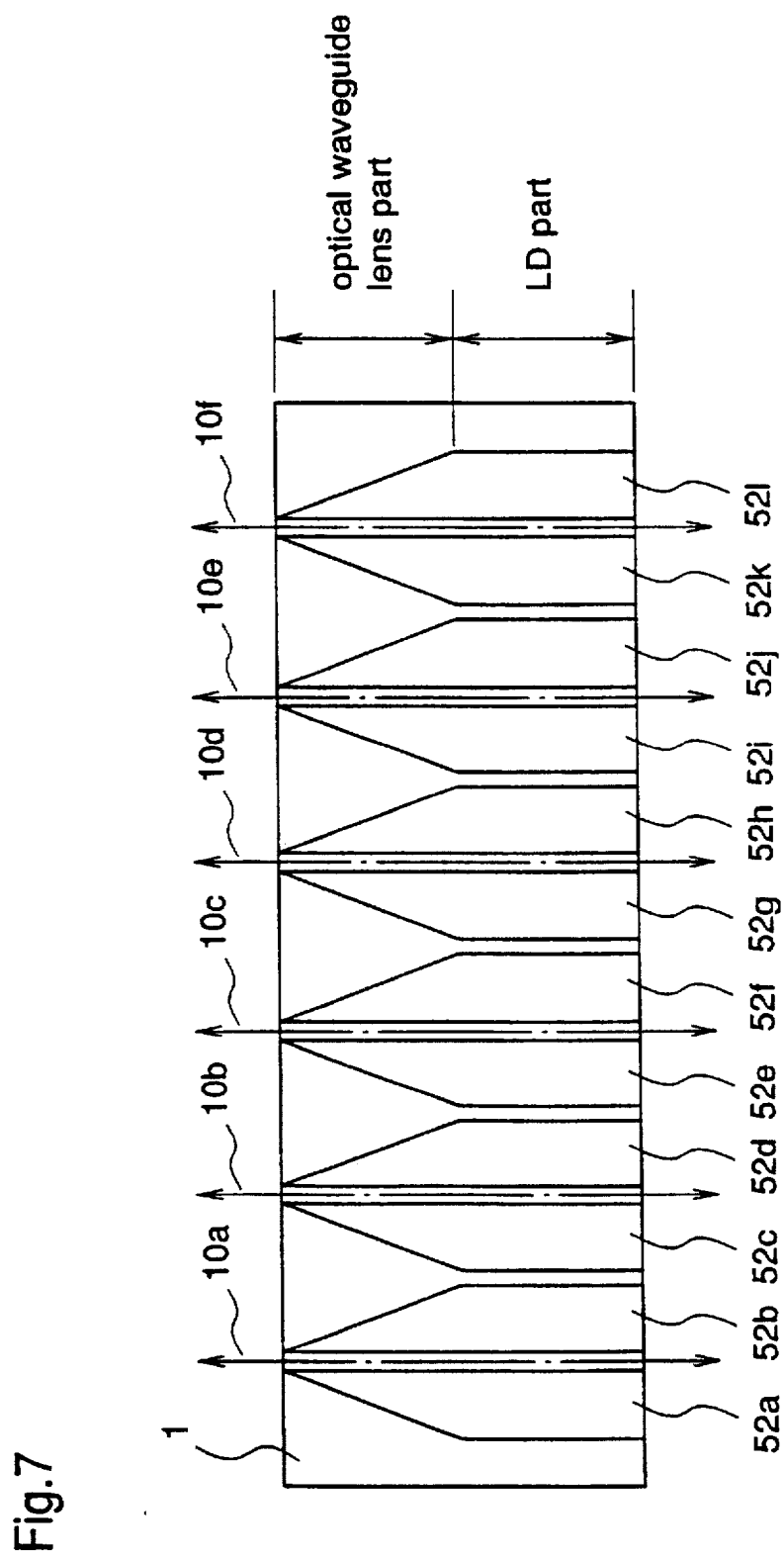
FIG. 7 is a schematic view for explaining the method of fabricating a semiconductor optical device according to a fourth embodiment of the present invention and a semiconductor optical array device manufactured by this fabricating method.

FIG. 7 is a diagram for explaining a method of fabricating a semiconductor optical device according to a fourth embodiment of the present invention and a semiconductor optical device fabricated by this fabricating method. In the figure, reference numerals 10a–10f designate hypothetical straight lines extending in the resonator length direction and arranged at equal intervals. Numerals 52a, 52b, 52c, 52d, 52e, 52f, 52g, 52h, 52i, 52j, 52k, and 52l designate selective growth masks constituting film pairs arranged in linear symmetry with the lines 10a–10f as their centers, respectively. Here, the widths of the mask pairs in the direction perpendicular to resonator length direction are all the same.

As shown in FIG. 7, selective growth masks of the first embodiment are arranged parallel to each other on the substrate 1, and semiconductor layers forming the optical waveguides are then selectively grown, whereby a structure in which a plurality of optical waveguides comprising semiconductor layers having a desired layer thickness profile in the resonator length direction, arranged in parallel, can be easily fabricated. Therefore, according to this fourth embodiment, a semiconductor optical array in which a plurality of semiconductor laser elements, each provided with an integrated optical waveguide lens, can be quite easily realized. The semiconductor optical device fabricated by the method of this fourth embodiment has a construction in which a plurality of semiconductor laser elements, each including an optical waveguide lens, are provided in close proximity to each other. Since the emission broadening angles of the laser beams emitted from the respective laser elements are small, it is possible to couple the laser beams from the respective laser elements with a plurality of optical fibers without using spherical lenses, and an optical coupling module for information transmission using a plurality of optical signals can be provided at quite a low cost.

While, in this fourth embodiment, the configuration of the respective selective growth masks have the same configurations as the selective growth mask of the first embodiment, the masks may have the same configuration as the selective growth masks of the second or the third embodiment.

Embodiment 5

Figure 8:
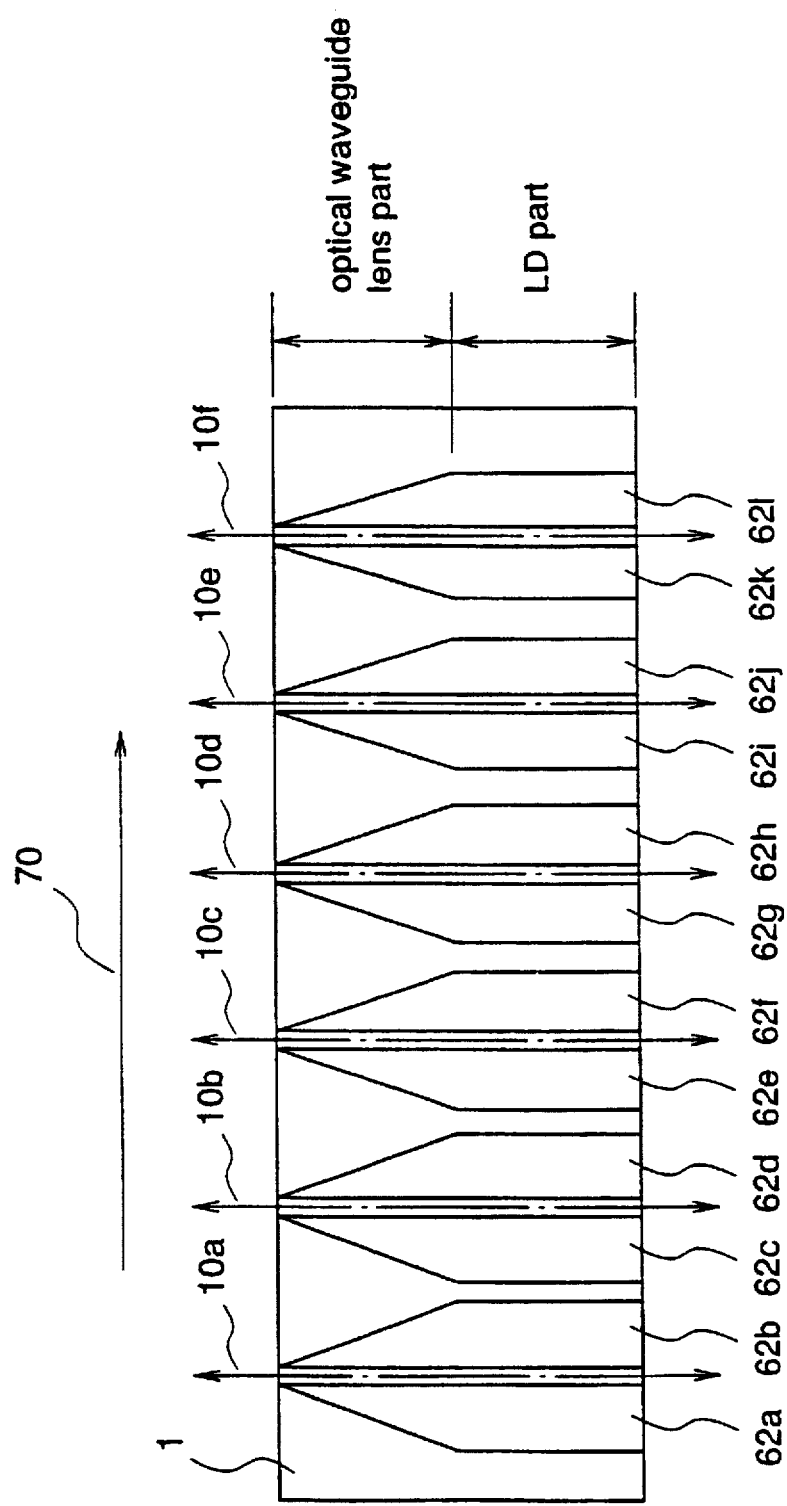
FIG. 8 is a schematic view for explaining a method of fabricating a semiconductor optical device according to a fifth embodiment of the present invention and a semiconductor optical array device manufactured by this fabricating method.
Figure 9:
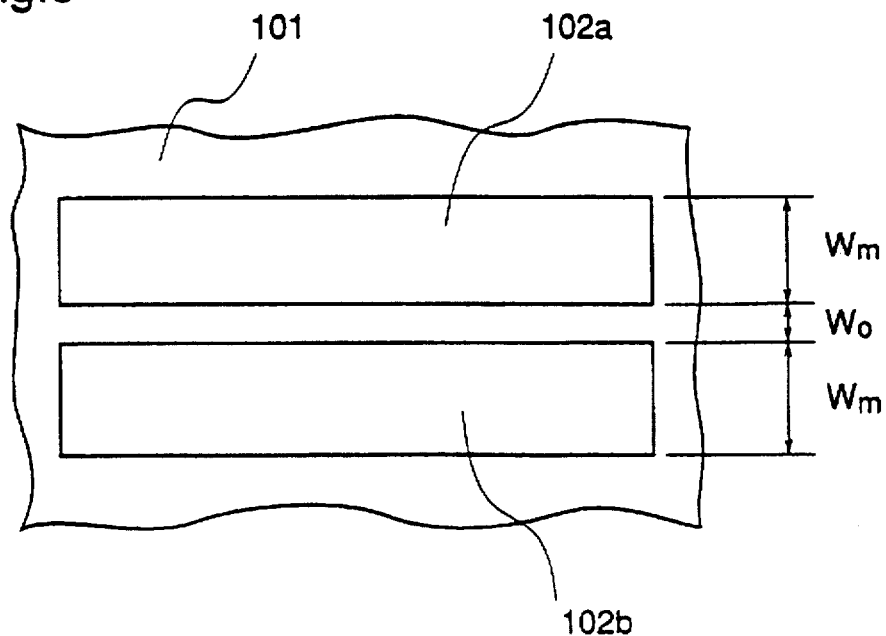
FIG. 9 is a schematic view for explaining the basic principle of selective area growth of a compound semiconductor layer utilizing a dielectric material.
Figure 10:
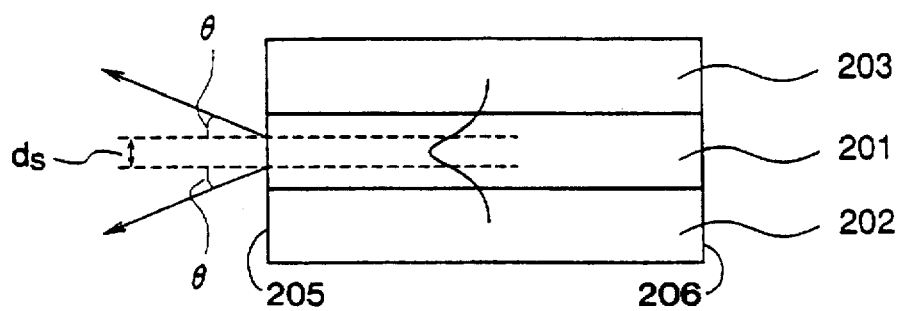
FIG. 10 is a cross-sectional view along the resonator length direction in the vicinity of the active layer of a conventional generalized semiconductor laser including an active layer having a multi-quantum well (MQW) structure employing InP based material.
Figure 11:
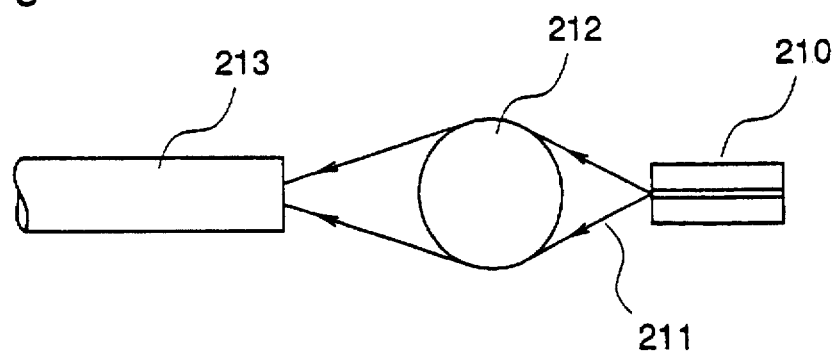
FIG. 11 is a schematic view for explaining the construction of an optical coupling module that couples emitted laser light to an optical fiber.

FIG. 8 is a diagram for explaining a method of fabricating a semiconductor optical device according to a fifth embodiment of the present invention and a semiconductor optical device fabricated by this fabricating method. In the figure, the same reference numerals designate the same or corresponding elements as those shown in FIG. 7. Reference numerals 62a, 62b, 62c, 62d, 62e, 62f, 62g, 62h, 62i, 62j, 62k, and 62l designate selective growth masks constituting film pairs arranged in a linear symmetry with the straight lines 10a–10f as their centers. Here, the widths in the direction perpendicular to the resonator length direction in the LD portion of the film pairs are successively narrowed toward the direction of the arrow 70.

As shown in FIG. 8, by arranging a plurality of selective growth masks according to the first embodiment which have different widths in the direction perpendicular to the resonator length direction in the LD portion of the mask in parallel to each other and then growing semiconductor layers forming the optical waveguides, a structure in which a plurality of optical waveguides comprising semiconductor layers having a desired layer thickness profile in the resonator length direction are arranged in parallel to each other. Thus, according to the method of fabricating the semiconductor optical device of this fifth embodiment, a semiconductor optical array in which a plurality of semiconductor laser elements, each provided with an integrated optical waveguide lens, can be quite easily realized.

In this fifth embodiment, the widths in the direction perpendicular to the resonator length direction of a plurality of masks arranged in parallel to each other in the LD portion are different from each other and the relative growth rates of the waveguide portions are different from each other, whereby the thicknesses of the well layers of the MQW waveguide change for respective elements, thereby realizing an array having different oscillation wavelengths for respective elements.

The semiconductor optical device fabricated according to this fifth embodiment has a plurality of semiconductor laser elements, each provided with an optical waveguide lens having a wavelength different from other elements in close proximity, and the emission broadening angles of the laser beams emitted from the respective laser elements are small. Therefore, it is possible to couple a plurality of laser beams emitted from the respective laser elements with a plurality of optical fibers without using spherical lenses, or to couple a laser beam with an optical fiber without using a spherical lens and to provide an optical coupling module for information transmission using a plurality of wavelengths at quite a low cost.

While the respective selective masks have the same configuration as the selective growth mask of the first embodiment, the configuration may be the same as that of the second or the third embodiment.

What is claimed is:

1. A method of fabricating a semiconductor optical device including an integrated laser diode and optical waveguide lens having a continuous resonator along a resonator length direction between a pair of resonator facets, the method comprising:

forming a selective mask on a substrate, said mask comprising a pair of dielectric films spaced from and having a linear symmetry with respect to a hypothetical straight line extending in the resonator length direction on the substrate, and edges directly opposing each other, defining an opening between the films, and parallel to the hypothetical line along the entire length of the edges, so that the opening has a constant width perpendicular to the resonator length direction, the films having widths in a direction perpendicular to the resonator length direction that are constant from a second resonator facet to a first position between the second resonator facet and a first resonator facet and that gradually narrow along the resonator length direction from the first position to the first resonator facet; and growing a semiconductor layer forming an optical waveguide of the semiconductor optical device on the substrate using the selective mask as a growth mask.

2. The method of claim 1, wherein a portion of each of said dielectric films having a width that gradually narrows has a right triangle configuration.

3. The method of claim 2, wherein the width of each of said dielectric films from the first position to a second facet is constant except at a central portion where the width is narrower.

4. The method of claim 1, wherein a portion of each of the dielectric films having a width that gradually narrows has a generally right triangle configuration including a curved hypotenuse.

5. The method of claim 4, wherein the width of each of said dielectric films from the first position to a second facet is constant except at a central portion where the width is narrower.

6. The method of claim 1, wherein the width of each of said dielectric films from the first position to a second facet is constant except at a central portion where the width is narrower.

7. The method of claim 1, wherein the widths of the dielectric films narrow to zero at the first facet.

8. A method of fabricating a semiconductor optical device including an integrated laser diode and optical waveguide lens having a continuous resonator along a resonator length direction between a pair of resonator facets, the method comprising:

forming a plurality of selective masks on a substrate, each mask comprising a pair of dielectric films spaced from and having a linear symmetry with respect to a hypothetical straight line extending in the resonator length direction on the substrate, and edges directly opposing each other, defining an opening between the films, and parallel to the hypothetical line along the entire length of the edges, so that the opening has a constant width perpendicular to the resonator length direction, the films having widths in a direction perpendicular to the resonator length direction that are constant from a second resonator facet to a first position between the second resonator facet and a first resonator facet and that gradually narrow along the resonator length direction from the first position to the first resonator facet, the masks being mutually parallel; and growing a semiconductor layer forming optical waveguides of the semiconductor optical device on the substrate using the selective masks as growth masks.

9. The method of claim 8, wherein a portion of each of said dielectric films having a width that gradually narrows has a right triangle configuration.

10. The method of claim 8, wherein a portion of each of the dielectric films having a width that gradually narrows has a generally right triangle configuration including a curved hypotenuse.

11. A method of simultaneously fabricating two semiconductor optical devices, each semiconductor optical device including an integrated laser diode and optical waveguide lens having a continuous resonator along a resonator length direction between a pair of resonator facets, the method comprising:

forming a selective mask on a substrate, said mask comprising a pair of dielectric films spaced from and having a linear symmetry with respect to a hypothetical straight line extending in the resonator length direction on the substrate, and edges directly opposing each other, defining an opening between the films, and parallel to the hypothetical line along the entire length of the edges so that the opening has a constant width perpendicular to the resonator length direction, the films having widths in a direction perpendicular to the resonator length direction that are constant from a central location corresponding to a second resonator facet of each of the two semiconductor optical devices to respective first positions between respective first resonator facets at opposite ends of the films along the resonator length direction and the central position and that gradually narrow along the resonator length direction from respective second positions located between the respective first positions and the first resonator facets toward the respective first resonator facets;

growing a semiconductor layer forming an optical waveguide of the semiconductor optical device on the substrate using the selective mask as a growth mask; and cleaving the grown semiconductor layer at the central location to form respective second resonator facets of the two semiconductor optical devices.

12. The method of claim 11, wherein the width of each of the dielectric films between the respective first positions is narrower than the width between adjacent first and second positions.

* * * * *